(12) United States Patent
Mao

(10) Patent No.: US 10,796,975 B2
(45) Date of Patent: Oct. 6, 2020

(54) SEMICONDUCTOR PACKAGE WITH SUPPORTED STACKED DIE

(71) Applicant: INTEL CORPORATION, Santa Clara, CA (US)

(72) Inventor: Guo Mao, Shanghai (CN)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/072,222

(22) PCT Filed: Apr. 2, 2016

(86) PCT No.: PCT/CN2016/078407
§ 371 (c)(1),
(2) Date: Jul. 24, 2018

(87) PCT Pub. No.: WO2017/166325
PCT Pub. Date: Oct. 5, 2017

(65) Prior Publication Data
US 2019/0035705 A1    Jan. 31, 2019

(51) Int. Cl.
*H01L 23/18* (2006.01)
*H01L 23/31* (2006.01)
(Continued)

(52) U.S. Cl.
CPC .............. *H01L 23/18* (2013.01); *H01L 23/16* (2013.01); *H01L 23/3135* (2013.01);
(Continued)

(58) Field of Classification Search
CPC ......... H01L 23/28–3192; H01L 21/563; H01L 2224/48145; H01L 2225/06562;
(Continued)

(56) References Cited

U.S. PATENT DOCUMENTS 6,147,104 A * 11/2000 Eicken .................... A01N 43/56
514/406
6,228,679 B1 * 5/2001 Chiu ...................... H01L 21/563
257/E21.503
(Continued)

FOREIGN PATENT DOCUMENTS

CN    101131993 A    2/2008
CN    101567364 A    10/2009
(Continued)

OTHER PUBLICATIONS

International Search Report issued in PCT/CN2016/078407, dated Jan. 6, 2017, 2 pages.

*Primary Examiner* — David A Zarneke
(74) *Attorney, Agent, or Firm* — Eversheds Sutherland (US) LLP

(57) ABSTRACT

Semiconductor packages with electromagnetic interference supported stacked die and a method of manufacture therefor is disclosed. The semiconductor packages may house a stack of dies in a system in a package (SiP) implementation, where one or more of the dies may be wire bonded to a semiconductor package substrate. The dies may be stacked in a partially overlapping, and staggered manner, such that portions of some dies may protrude out over an edge of a die that is below it. This dies stacking may define a cavity, and in some cases, wire bonds may be made to the protruding portions of the die. Underfill material may be provided in the cavity and cured to form an underfill support. Wire bonding of the bond pads overlying the cavity formed by the staggered stacking of the dies may be performed after the formation of the underfill support.

20 Claims, 8 Drawing Sheets

(51) Int. Cl.
    *H01L 25/065* (2006.01)
    *H01L 23/00* (2006.01)
    *H01L 23/16* (2006.01)

(52) U.S. Cl.
    CPC .............. *H01L 24/00* (2013.01); *H01L 24/29*
        (2013.01); *H01L 24/32* (2013.01); *H01L 24/83*
        (2013.01); *H01L 24/85* (2013.01); *H01L 24/92*
        (2013.01); *H01L 25/0657* (2013.01); *H01L*
        *23/3128* (2013.01); *H01L 24/45* (2013.01);
        *H01L 24/48* (2013.01); *H01L 24/78* (2013.01);
        *H01L 2224/2929* (2013.01); *H01L 2224/29298*
        (2013.01); *H01L 2224/45012* (2013.01); *H01L*
        *2224/45015* (2013.01); *H01L 2224/45124*
        (2013.01); *H01L 2224/45139* (2013.01); *H01L*
        *2224/45144* (2013.01); *H01L 2224/45147*
        (2013.01); *H01L 2224/4847* (2013.01); *H01L*
        *2224/48091* (2013.01); *H01L 2224/48145*
        (2013.01); *H01L 2224/48227* (2013.01); *H01L*
        *2224/48463* (2013.01); *H01L 2224/73265*
        (2013.01); *H01L 2224/78301* (2013.01); *H01L*
        *2224/83855* (2013.01); *H01L 2224/85007*
        (2013.01); *H01L 2224/85186* (2013.01); *H01L*
        *2224/85205* (2013.01); *H01L 2225/0651*
        (2013.01); *H01L 2225/06506* (2013.01); *H01L*
        *2225/06562* (2013.01); *H01L 2225/06575*
        (2013.01); *H01L 2225/06586* (2013.01); *H01L*
        *2924/1434* (2013.01); *H01L 2924/1436*
        (2013.01); *H01L 2924/15311* (2013.01); *H01L*
        *2924/181* (2013.01)

(58) Field of Classification Search
    CPC . H01L 25/043; H01L 25/0657; H01L 25/074;
                    H01L 25/0756; H01L 25/117
    See application file for complete search history.

(56) References Cited

U.S. PATENT DOCUMENTS

| | | | | |
|---|---|---|---|---|
| 6,337,226 B1* | 1/2002 | Symons | .............. | H01L 23/3185 257/777 |
| 6,353,203 B1* | 3/2002 | Hokodate | ............ | B23K 26/032 219/121.67 |
| 6,353,263 B1* | 3/2002 | Dotta | .................... | H01L 21/561 257/685 |
| 6,448,659 B1* | 9/2002 | Lee | ......................... | H01L 23/24 257/723 |
| 6,621,172 B2* | 9/2003 | Nakayama | ............ | H01L 21/563 257/686 |
| 7,087,455 B2* | 8/2006 | Fukuda | .................. | H01L 24/13 257/E21.503 |
| 7,091,623 B2* | 8/2006 | Tsai | ........................ | H01L 24/97 257/723 |
| 7,119,426 B2* | 10/2006 | Fukui | ..................... | H01L 24/83 257/686 |
| 7,190,051 B2* | 3/2007 | Mech | ................ | H01L 21/76251 257/632 |
| 7,521,809 B2* | 4/2009 | Birzer | ..................... | H01L 22/32 257/685 |
| 7,906,853 B2* | 3/2011 | Wang | ..................... | H01L 24/49 257/686 |
| 7,928,551 B2* | 4/2011 | Fujiwara | ............... | H01L 21/561 257/686 |
| 7,956,449 B2* | 6/2011 | Lee | ...................... | H01L 21/6835 257/686 |
| 8,004,071 B2* | 8/2011 | Nishiyama | ............. | G11C 5/063 257/676 |
| 8,084,856 B2* | 12/2011 | Hu | ...................... | H01L 25/0657 257/686 |
| 8,120,156 B2* | 2/2012 | Camacho | ............... | H01L 25/03 257/686 |
| 8,230,942 B2* | 7/2012 | Steverding | ............. | B25B 21/00 173/1 |
| 8,362,624 B2* | 1/2013 | Kang | ................. | H01L 23/3135 257/774 |
| 8,390,114 B2* | 3/2013 | Kim | ........................ | H01L 24/16 257/723 |
| 8,415,808 B2* | 4/2013 | Liao | .................... | H01L 25/0657 257/777 |
| 8,552,546 B2* | 10/2013 | Song | ....................... | H01L 23/16 257/686 |
| 8,664,757 B2* | 3/2014 | Cho | ...................... | H01L 21/568 257/678 |
| 8,691,628 B2* | 4/2014 | Tane | ....................... | H01L 21/78 438/109 |
| 8,923,004 B2* | 12/2014 | Low | ..................... | H01L 21/565 361/760 |
| 8,946,909 B2* | 2/2015 | Cho | ...................... | H01L 21/563 257/777 |
| 9,171,819 B2* | 10/2015 | Lee | ...................... | H01L 25/0657 |
| 9,240,393 B2* | 1/2016 | Yu | ....................... | H01L 23/3135 |
| 9,293,443 B2* | 3/2016 | Nam | ................... | H01L 25/0657 |
| 9,728,476 B2* | 8/2017 | Chung | ................... | H01L 24/48 |
| 9,741,644 B2* | 8/2017 | Katti | .................. | H01L 23/49575 |
| 9,984,947 B2* | 5/2018 | Chung | ................... | H01L 24/48 |
| 10,153,179 B2* | 12/2018 | Lin | ........................ | H01L 21/56 |
| 2010/0117244 A1* | 5/2010 | Miyagawa | ............. | H01L 24/32 257/778 |
| 2010/0237490 A1* | 9/2010 | Chu | ...................... | H01L 21/56 257/692 |
| 2010/0314740 A1* | 12/2010 | Choi | .................. | H01L 23/3121 257/686 |
| 2012/0248628 A1* | 10/2012 | Tanaka | ................ | H01L 23/3135 257/777 |
| 2013/0093103 A1* | 4/2013 | Kim | .................... | H01L 25/0657 257/777 |
| 2015/0214193 A1* | 7/2015 | Yoshimura | .......... | H01L 25/0657 257/777 |

FOREIGN PATENT DOCUMENTS

| | | |
|---|---|---|
| CN | 202549832 A | 11/2012 |
| CN | 105390482 A | 3/2016 |

\* cited by examiner

SEMICONDUCTOR PACKAGE WITH SUPPORTED STACKED DIE

CROSS-REFERENCE TO RELATED APPLICATION(S)

This application is a U.S. National Stage Application under 35 U.S.C. 371 and claims the priority benefit of International Application No. PCT/CN2016/078407, filed Apr. 2, 2016, which is incorporated herein by reference as if set forth in full.

TECHNICAL FIELD

This disclosure generally relates to semiconductor packages, and more particularly to semiconductor packages with supported stacked die.

BACKGROUND

Integrated circuit(s) and other electronic devices may be packaged on a semiconductor package in a stacked manner. The stacked dies may be provided in a staggered manner to allow exposure of bond pads on the stacked dies and wire bonding of the dies to other dies in the die stack and/or to a semiconductor package substrate. In some cases, wire bonding may be performed on a portion of a stacked die that protrudes out in a lateral direction farther than an underlying die. In this case, wire bonding to bond pads in the protruded portion of the die may result in bending of the protruded portion during wire bonding. This bending may result in poor registration of the wire bonding placement, unreliable bonds, and/or damage to the die.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1A:
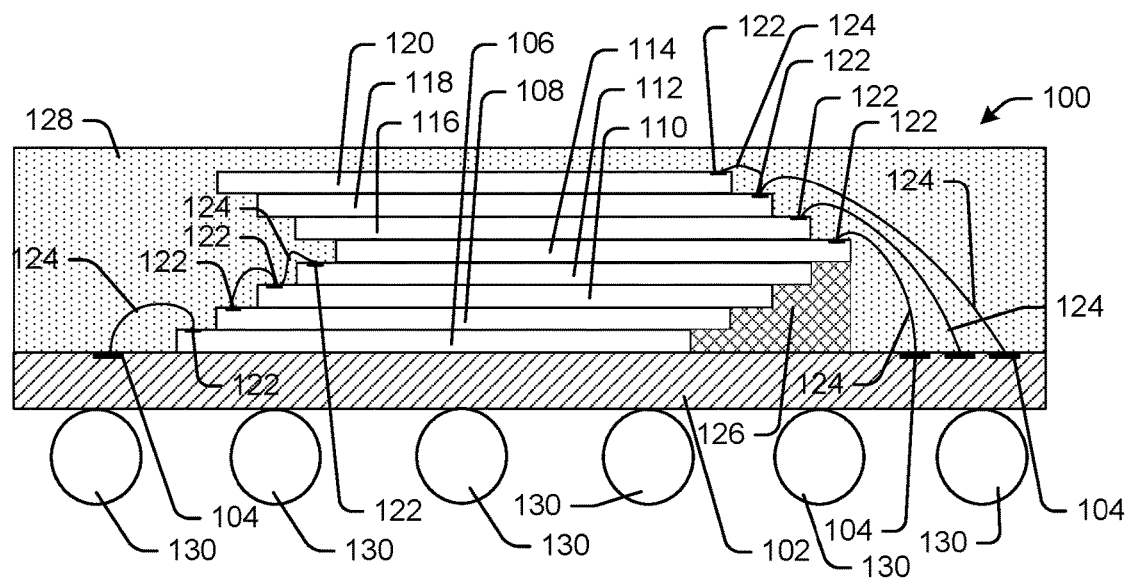
FIGS. 1A-1B depict simplified cross-sectional schematic diagrams of example semiconductor packages with supported stacked die, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure, and it is to be understood that other embodiments would be evident based on the present disclosure and that process, mechanical, materials, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the invention are semi-diagrammatic and not to scale and, particularly, some of the dimensions are for the clarity of presentation and may be exaggerated in the drawings. In addition, where multiple embodiments are disclosed and described having some features in common, for clarity and ease of illustration, description, and comprehension thereof, similar and like features one to another will ordinarily be described with like reference numerals even if the features are not identical.

The term "horizontal" as used herein may be defined as a direction parallel to a plane or surface (e.g., surface of a substrate), regardless of its orientation. The term "vertical," as used herein may refer to a direction orthogonal to the horizontal direction as just described. Terms, such as "on", "above", "below", "bottom", "top", "side" (as in "sidewall"), "higher", "lower", "upper", "over", and "under", may be referenced with respect to the horizontal plane. The term "processing" as used herein includes deposition of material (e.g., metal, dielectric, photoresist, etc.), patterning, exposure, development, laminating, curing, etching, cleaning, ablating, polishing, and/or removal of the material or photoresist as required in forming a described structure.

Embodiments of the disclosure may provide a semiconductor package and a method for fabrication of the semiconductor package. In example embodiments, the semiconductor package may have two or more stacked dies, as described herein. These semiconductor packages with the stacked die may be fabricated using methods as disclosed herein.

In example embodiments, semiconductor package structures may include a package substrate. In some cases, the package substrate may be an organic structure. In other cases, the package substrate may be inorganic (e.g., ceramic, glass, etc.). The package substrate, in example embodiments, may include a core layer with one or more interconnect layers built up on one or both sides of the core layer. Electronic components, including integrated circuit dies may be electrically and mechanically coupled to the package substrate via any suitable mechanism, such as wire bonds. Semiconductor package-to-board level interconnects may be provided on one or both sides of the package substrate. In example embodiments, the semiconductor package-to-board level connections may be land grid array (LGA) connections, ball grid array (BGA) connections, or indeed, any suitable package-to-board interconnect.

In example embodiments, the semiconductor package substrate may be processed in a batch fashion, where multiple semiconductor packages may be fabricated from a relatively large semiconductor package substrate that may be singulated to form each of the semiconductor packages. In other example embodiments, the semiconductor package substrate may be singulated prior to providing the stacked dies thereon. The semiconductor package substrate, in example embodiments, may have a core with any number of build-up layers formed on one or both sides of the core. The build-up layers and/or the core may have metal traces and/or vias formed therein to route electrical signals to, from, or between dies of the stacked die. For example, signals from dies of the die stack may be routed to the semiconductor package substrate and fanned out to the package-to-board interconnects assembled on the semiconductor package substrate.

In example embodiments, a die stack having two or more dies, where at least one die is at least partially disposed over the top of another die, may be provided on the semiconductor package substrate. A first die provided at least partially over the top of a second die may, at least partially, protrude out beyond an edge of the second die. In other words, a portion of the first die when stacked on the second die may not have any portion of the second die thereunder. Thus, the protruding portion of the first die may be a cantilever without any support thereunder. If a wire bond is to be formed on a wire bond pad disposed on the protruding and cantilevered portion of the first die, then the wire bonding process may bend the protruding, unsupported portion. This may result in alignment, registration, reliability, and/or die cracking/chipping issues. According to example embodiments of the disclosure, there may be underfill material provided in the cavity under the protruding portion of the first die. In these example embodiments, the underfill material may be disposed under and/or adjacent to the cavity under the first die. The underfill material may then be cured to form a support under the first die. With the support under the protruding portion of the first die, forming a wire bond on a wire bond pad on the protruding portion may be relatively more reliable (e.g., better registration, more stability, reduced die deflection, reduced die cracking).

It will be appreciated that the mechanism of die stacking and providing underfill thereunder may be performed on a die stack of any number of die or on any number of cavities that may form from the stacking of dies. For example, a first set of four dies may be stacked in an offset manner (e.g., partially overlapping and having a protruding portion relative to the die immediately underneath) on the semiconductor package substrate. The dies may be offset to provide clearance of bond pads on one or more sides of the dies that are partially covered by dies that partially overly them. After mechanically attaching the four dies, wire bonding may be performed on the four dies on one side of the die stack. There may be a cavity defined by the second, third, and fourth die in the four die stack. Then a second set of four more dies may be stacked on the first set of four dies in an offset manner. At this point, the cavity that is present under some of the dies of the first set of stacked dies may be filled with underfill and the underfill may be cured (e.g. crosslinked). Then wire bonding may be performed on the fourth die (counting from bottom to top) to the eighth die of the eight die stack. Because of the underfill under the fourth die, the fourth die of the die stack may have support underneath the regions where wire bonding is to be performed. Thus, when performing wire bond on the fourth die, there may be support under that fourth die portion overhanging the third die due to the underfill. The underfill may thus reduce the level of deflection of the fourth die overhang portion when performing wire bonding. In other words, the forces imparted by the wire bond head when wire bonding to an overhang portion of a die may result in reduced deflection of that overhang portion when there is support underneath that portion. With the reduced deflection of that overhang portion, it will be appreciated that there may be a reduced level of misalignment, in the wire bonding, particularly when having relatively tight pitch bond pads.

Figure 1B:
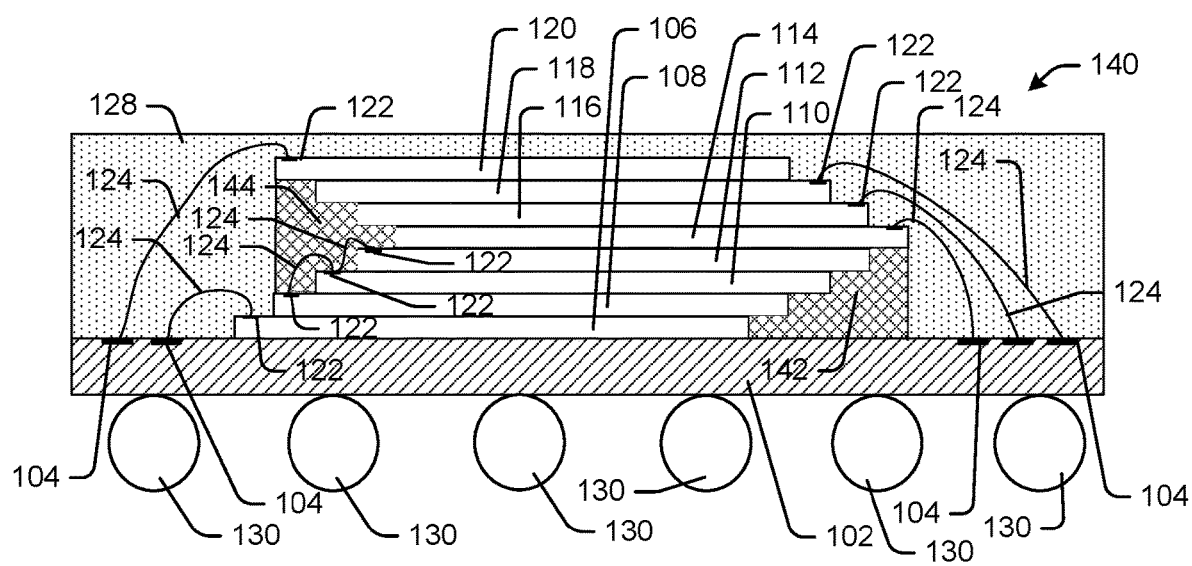

FIGS. 1A-1B depict simplified cross-sectional schematic diagrams of example semiconductor packages 100, 140 with supported stacked die, in accordance with example embodiments of the disclosure. The example semiconductor package 100 of FIG. 1A may have a single portion where underfill material 126 is provided for the purposes of supporting one or more stacked dies 106, 108, 110, 112, 114, 116, 118, 120. The example semiconductor package 140 of FIG. 1B may have two portions where underfill material 126, 144 are provided for the purposes of supporting one or more stacked dies 106, 108, 110, 112, 114, 116, 118, 120.

The semiconductor package 100, 140 may include a semiconductor package substrate 102. The semiconductor package substrate 102 may be of any suitable size and/or shape. For example, the semiconductor package substrate 102, in example embodiments, may be a rectangular shape that is greater in area than any one of the stacked dies 106, 108, 110, 112, 114, 116, 118, 120. In example embodiments, the semiconductor package substrate 102 may be fabricated of any suitable material, including polymer material, ceramic material, plastics, composite materials, glass, epoxy laminates of fiberglass sheets, FR-4 materials, FR-5 materials, combinations thereof, or the like. The semiconductor package substrate 102 may have a core layer and any number of interconnect build-up layers on either side of a core layer. The core and/or the interconnect build-up layers may be any variety of the aforementioned materials, and in some example embodiments, may not be constructed of the same material types. In some example embodiments, a coreless integration may be used where there may be one or more levels of interconnected traces included in the semiconductor package substrate 102 without having a core.

The semiconductor package substrate 102 may have any number of wire bond pads 104 formed thereon, such as on one or more surfaces of the semiconductor package substrate 102. The semiconductor package substrate 102 may also have a designated area where the stacked dies 106, 108, 110, 112, 114, 116, 118, 120 are placed. The wire bond pads 104 may enable electrical wire bonds 124 between die level bond pads 122 and the semiconductor package substrate 102. The semiconductor package substrate 102 may have any number electrical traces and/or vias disposed therein (e.g., such as in the semiconductor package substrate 102 build-up layers and/or cores). Theses electrical traces and/or vias may enable the routing of signals between the stacked dies 106, 108, 110, 112, 114, 116, 118, 120, to/from the stacked dies 106, 108, 110, 112, 114, 116, 118, 120 to the semiconductor package substrate 102, and/or to/from the stacked dies 106, 108, 110, 112, 114, 116, 118, 120 to a printed circuit board via one or more semiconductor package-to-board interconnects 130.

The package substrate level wire bond pads 104 may be of any suitable size (e.g., fixed size or variable size). For example, the wire bond pads 104 may be in the range of about 30 microns (μm) to about 300 μm on each side. The wire bond pads 104 may be of any suitable spacing (e.g., fixed spacing or variable spacing). For example, the dimensions of the wire bond pads 104 may have a pitch ranging from about 50 microns (μm) to about 500 μm on each side. The die level bond pads 122 may be of any suitable size (e.g., fixed size or variable size). For example, the dimensions of the die level bond pads 122 may be in the range of about 20 μm to about 200 μm on each side. In a non-limiting example, the bond pad 122 size may be 55 μm by 55 μm. In another non-limiting example, the bond pad 122 size may be 75 μm by 75 μm. In yet another non-limiting example, the bond pad 122 size may be 35 μm by 65 μm. It will also be appreciated that in some example embodiments, the bond pads 122 on each of the dies 106, 108, 110, 112, 114, 116, 118, 120 may be of dissimilar size. Bond wire 124 for wire bonding may be of any suitable material including, but not limited to, copper, gold, silver, aluminum, alloys and/or intermetallics of any of the preceding materials, combinations thereof, or the like. The bond wire may be of any suitable diameter, such as in the range of about 5 μm to about 200 μm. The bond wire may be attached between bond pad 122 of the dies 106, 108, 110, 112, 114, 116, 118, 120 and wire bond pad 104 of the semiconductor package substrate 102 using any suitable mechanism including, but not limited to, ball bonding, wedge bonding, compliant bonding, ultrasonic bonding, combinations thereof, or the like. It will be appreciated that the wire bonds 124 may route signals between stacked dies 106, 108, 110, 112, 114, 116, 118, 120 or between stacked dies 106, 108, 110, 112, 114, 116, 118, 120 and the semiconductor package substrate 102. In example embodiments, the package-to-board interconnects 130 for package level I/O may be provided on the semiconductor package substrate 102. The package-to-board interconnects 130 may be any suitable contacts, such as land grid array (LGA), ball grid array (BGA), other any other suitable package-to-board interconnects.

It will be appreciated that the dies 106, 108, 110, 112, 114, 116, 118, 120 may be any suitable type of electronic device and/or integrated circuit. For example the stacked dies 106, 108, 110, 112, 114, 116, 118, 120 may be any one or more of memory die, microcontrollers, microprocessors, baseband processors, digital signal processors, field gate arrays, memory die, logic gate die, passive component die, MEMS, surface mount devices, application specific integrated circuits, baseband processors, amplifiers, filters, combinations thereof, or the like may be packaged in the semiconductor packages 100, 140, as disclosed herein. The semiconductor packages 100, 140, as disclosed herein may be provided in any variety of electronic device including, consumer, industrial, military, communications, infrastructural, and/or other electronic devices.

As a non-limiting example, the semiconductor package 100, 140, as described herein, may be used to house stacked memory chips. The memory chips may include one or more volatile and/or non-volatile memory devices including, but not limited to, magnetic storage devices, read only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read only memory (EEPROM), non-volatile RAM (NVRAM), universal serial bus (USB) removable memory, or combinations thereof. The memory chips may be of any suitable memory capacity (e.g., 256 gigabit flash memory).

In some cases, the dies 106, 108, 110, 112, 114, 116, 118, 120 of the die stack may be homogeneous (e.g., all memory devices, all same capacity, etc.). In other cases, the dies 106, 108, 110, 112, 114, 116, 118, 120 may be heterogeneous (e.g., different device types, all memory devices with different memory capacities, etc.). The dies 106, 108, 110, 112, 114, 116, 118, 120 may be of any suitable thickness. In example embodiments, the dies 106, 108, 110, 112, 114, 116, 118, 120 may be thinned down from the as-manufactured thicknesses of the silicon wafers on which they were manufactured. In example embodiments, the dies 106, 108, 110, 112, 114, 116, 118, 120 may each be in a thickness range of about 20 μm and about 1 mm. In some further example embodiments, the dies 106, 108, 110, 112, 114, 116, 118, 120 may be in the range of about 50 μm and about 200 μm. It will be appreciated that in some cases, the dies 106, 108, 110, 112, 114, 116, 118, 120 may all be of substantially the same thickness, and in other cases, one or more of the dies 106, 108, 110, 112, 114, 116, 118, 120 may be of a different thickness than each other.

It will be appreciated that the semiconductor package 100, 140, as described herein, may embody and/or be modified, according to example embodiments of the disclosure, to be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided with the supported stacked die and methods of fabrication, as described herein. Indeed, in example embodiments, the semiconductor package 100, 140 may include other dies or electronic components in addition to the stacked dies 106, 108, 110, 112, 114, 116, 118, 120.

In example embodiments, underfill 126, 142, 144 may be disposed under one or more dies 106, 108, 110, 112, 114, 116, 118, 120 of the die stack. For example, in FIG. 1A, underfill 126 is provided under at least a portion of dies 106, 108, 110, 112, 114. The underfill 126 may provide support to die 114 when wire bonding is performed on the bond pads 122 of die 114. Thus, the underfill 126 may prevent and/or reduce deflection of die 114 during the wire bonding process. As a result, the wire bonding process may be relatively more robust and/or reliable compared to not having the underfill 126 supporting the die 114, and in some cases, result in a reduced possibility of damaging the die 114. Similarly, in FIG. 1B, underfill 142 is provided under portions of dies 106, 108, 110, 112, 114 and underfill 144 is provided under portions of dies 116, 118, 120. Underfill 144, in example embodiments, may also overlie or be adjacent to dies 106, 108, 110, 112, 114.

In example embodiments, the underfill 126, 142, 144 may be formed by depositing under or adjacent to the dies 106, 108, 110, 112, 114, 116, 118, 120, underfill epoxy materials and then curing (e.g., hardening, cross-linking, etc.) the underfill epoxy material. The epoxy material may be off-the-shelf underfill epoxy materials that may be used for one or more other purposes, such as forming underfill under flipchip die. Alternatively, the epoxy material may be engineered (e.g., viscosity, additives, etc.) to wick under (e.g., by capillary, Van der Waals forces, etc.) under one or more dies 106, 108, 110, 112, 114, 116, 118, 120. Representative epoxy materials in the underfill 126, 142, 144 may include an amine epoxy, imidizole epoxy, a phenolic epoxy, or an anhydride epoxy. Other examples of underfill material include polyimide, benzocyclobutene (BCB), a bismalleimide type underfill, a polybenzoxazine (PBO) underfill, or a polynorborene underfill. Additionally, the underfill material 126, 142, 144 may include one or more suitable filler materials, such as silica. Underfill material 126, 142, 144 may be introduced by a nozzle under or relatively near the dies 106, 108, 110, 112, 114, 116, 118, 120 under which support is to be provided. In example embodiments, the underfill 126, 142, 144 may have fillers and/or other materials therein to preferentially control the coefficient of thermal expansion (CTE), reduce stresses, impart flame retardant properties, promote adhesion, and/or reduce moisture unptake in the underfill 126, 142, 144.

In example embodiments, the semiconductor packages 100, 140 may include molding 128 encapsulating a surface of the semiconductor package substrate 102 and the dies 106, 108, 110, 112, 114, 116, 118, 120. The molding material may be any suitable molding material. For example, the molding material may be a liquid dispensed thermosetting epoxy resin mold compound. A mold compound may be deposited on the surface of the semiconductor packaging substrate 102 using any suitable mechanism, including, but not limited to, liquid dispense, spin coating, spray coating, combinations thereof, or the like. The mold compound, after dispense onto the top surface of the semiconductor package substrate 100, 140, may be cured. Upon curing (e.g., cross-linking) the deposited molding compound may harden and form molding 128 to adhere to the semiconductor package substrate 102 and encapsulating the dies 106, 108, 110, 112, 114, 116, 118, 120. In example embodiments, the molding 128 may have fillers and/or other materials therein to preferentially control CTE, reduce stresses, impart flame retardant properties, promote adhesion, and/or reduce moisture unptake in the molding 108. The molding 128, in example embodiments, may be any suitable thickness. For example, the molding 128 may be approximately 1 millimeter (mm) thick. In other cases, the molding 128 may be approximately in the range between about 200 microns (µm) and 800 µm thick. In yet other cases, the molding 128 may be approximately in the range between about 1 mm and 2 mm thick.

FIGS. 2A-2H depict simplified cross-sectional schematic diagrams of an example semiconductor package with supported stacked die and a fabrication process therefor, in accordance with example embodiments of the disclosure.

The processes, as depicted herein, may be implemented to concurrently or nearly concurrently fabricate a plurality of semiconductor packages with supported stacked die. The semiconductor package may be fabricated with any variety of processes or sequences thereof. Although a particular fabrication sequence is shown here with fabrication of various structures and/or features, both final and/or temporary, any variations for fabricating similar features may be implemented in accordance with example embodiments of the disclosure. Further still, there may be additional and/or fewer features than the features disclosed herein for the fabrication of the semiconductor package, in accordance with example embodiments of the disclosure. Although the cross-sections as depicted here show a particular number of semiconductor packages fabricated concurrently on a package substrate panel, it will be appreciated that there may be any number of semiconductor packages that are fabricated concurrently or nearly concurrently on a particular package substrate panel. Additionally, although an example embodiment of the sequence of processes for fabricating a semiconductor package with supported stacked die is depicted, it will be appreciated that there may be any number of package substrate panels that may be processed concurrently and/or near concurrently through any of the processes depicted herein. For example, some processes may be batch processes where a particular unit (e.g., package substrate panel) may be processed along with another of that unit. In other cases, unit processes may be performed in a sequential manner on work-in-progress (WIP).

Figure 2A:
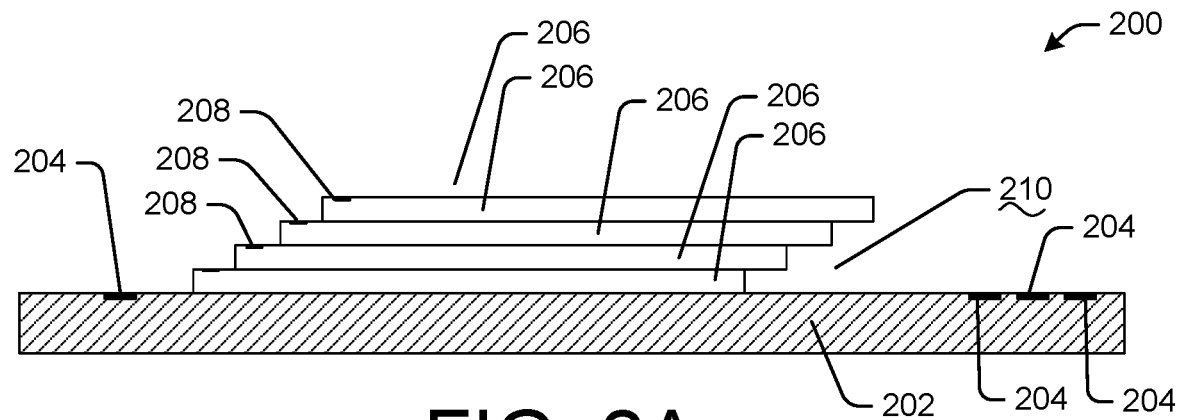
FIGS. 2A-2H depict simplified cross-sectional schematic diagrams of an example semiconductor package with supported stacked die and a fabrication process therefor, in accordance with example embodiments of the disclosure.

In FIG. 2A, a schematic cross-section of an example partially fabricated semiconductor package 200 with semiconductor package substrate 202 is depicted with one or more package substrate bond pads 204 fabricated on a surface of the package substrate 202, in accordance with example embodiments of the disclosure. The package substrate 202 may be of any suitable size and/or shape. For example, the package substrate 202, in example embodiments, may be a rectangular panel. In example embodiments, the package substrate may fabricated of any suitable material, including polymer material, ceramic material, plastics, composite materials, glass, epoxy laminates of fiber-glass sheets, FR-4 materials, FR-5 materials, combinations thereof, or the like. The substrate may have a core layer and any number of interconnect build-up layers on either side of a core layer. The core and/or the interconnect build-up layers may be any variety of the aforementioned materials, and in some example embodiments, may not be constructed of the same material types. In some example embodiments, the package substrate 202 may be a coreless package substrate.

It will be appreciated that the build-up layers may be fabricated in any suitable fashion. For example a first layer of build-up interconnect may include providing a package substrate core, with or without through holes formed therein. Dielectric laminate material may be laminated on the semiconductor substrate core material. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like. Subsequent build-up layers (e.g., higher levels of build-up layers) on either side of the core may be formed by the same aforementioned processes. The package substrate bond pads 204 may be, in example embodiments, fabricated in a build-up layer (e.g., top build-up layer) within the semiconductor package substrate 202.

The package substrate 100 may have one or more stacked dies 206 disposed thereon. Although for illustrative purposes, four stacked dies 206 are depicted, it will be appreciated that there may be any suitable number of stacked dies 206 provided on the semiconductor package substrate 202, in accordance with example embodiments of the disclosure. The stacked dies 206 may be any suitable electronic components 106, including, but not limited to, memory devices, integrated circuits, active devices, passive devices, diodes, transistors, resistors, inductors, capacitors, MEMS, combinations thereof, or the like. The stacked dies 206 may be mechanically coupled to the package substrate 202 via any suitable mechanism, such as epoxy, adhesives, mechanical holders, metal contacts, or the like. In example embodiments, the dies 206 may be stacked substantially directly on top of each other. In other example embodiments, there may be spacer materials provided between each of the dies 206 of the die stack. The dies 206 may have bond pads 208 formed thereon, such as on a final metal routing layer of the dies 206. These bond pads 208 may be suitable for wire bonding thereto. It will be appreciated that when the dies 206 are stacked in a staggered and partially overlapping manner, a cavity 210 may form under one or more of the stacked dies 206.

Figure 2B:
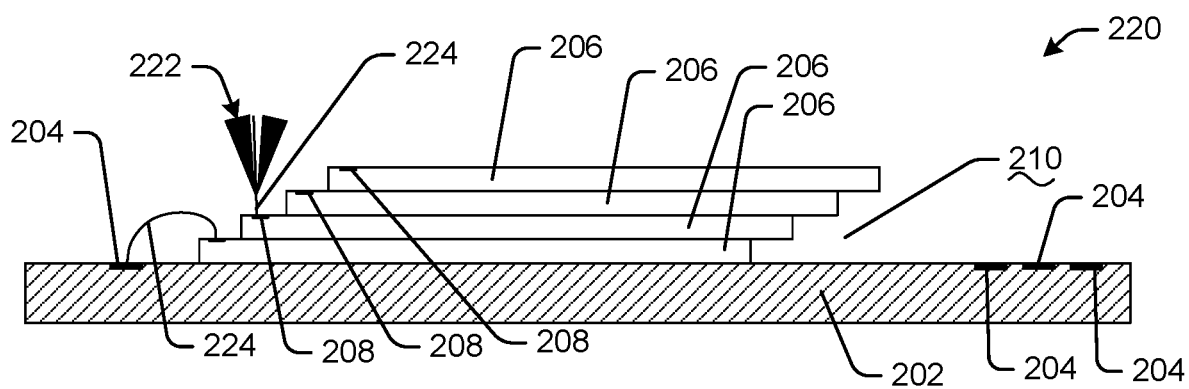

In FIG. 2B, a schematic cross-section of an example partially fabricated semiconductor package 220 with wire bonds 224 formed thereon is depicted, in accordance with example embodiments of the disclosure. The wire bonds 224 may connect between two or more bond pads 208, or between bond pads 208 and bond pads 204. Bond wire 224 for wire bonding may be of any suitable material including, but not limited to, copper, gold, silver, aluminum, alloys and/or intermetallics of any of the preceding materials, combinations thereof, or the like. The bond wire 224 may be of any suitable diameter, such as in the range of about 5 µm to about 200 µm. The bond wire 224 may be attached using any suitable mechanism including, but not limited to, ball bonding, wedge bonding, compliant bonding, ultrasonic bonding, combinations thereof, or the like. In example embodiments, a wire bonding head 222 may align and attach the wire bond 224 to a bond pad 208 and another bond pad 204, 208.

Figure 2C:
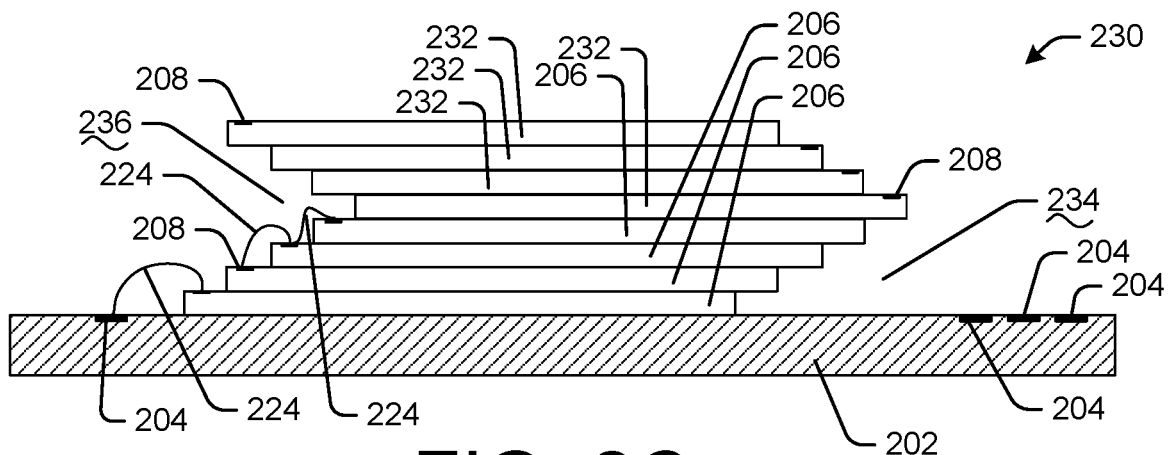

In FIG. 2C, a schematic cross-section of an example partially fabricated semiconductor package 230 with additional stacked dies 232 thereon is depicted, in accordance with example embodiments of the disclosure. The stacked dies 206 may be any suitable electronic components 232, including, but not limited to, memory devices, integrated circuits, active devices, passive devices, diodes, transistors, resistors, inductors, capacitors, MEMS, combinations thereof, or the like. The stacked dies 232 may be mechanically coupled to the stacked dies 206 via any suitable mechanism, such as epoxy, adhesives, mechanical holders, metal contacts, or the like. In example embodiments, the dies 232 may be stacked substantially directly on top of each other. In other example embodiments, there may be spacer materials provided between each of the dies 206, 232 of the die stack. Like the dies 206, the dies 232 may have bond pads 208 formed thereon, such as on a final metal routing layer of the dies 232. These bond pads 208 may be suitable for wire bonding thereto. It will be appreciated that when the dies 232 are stacked in a staggered and partially overlapping manner, one or more cavities 234, 236 may form under one or more of the stacked dies 206, 232.

Figure 2D:
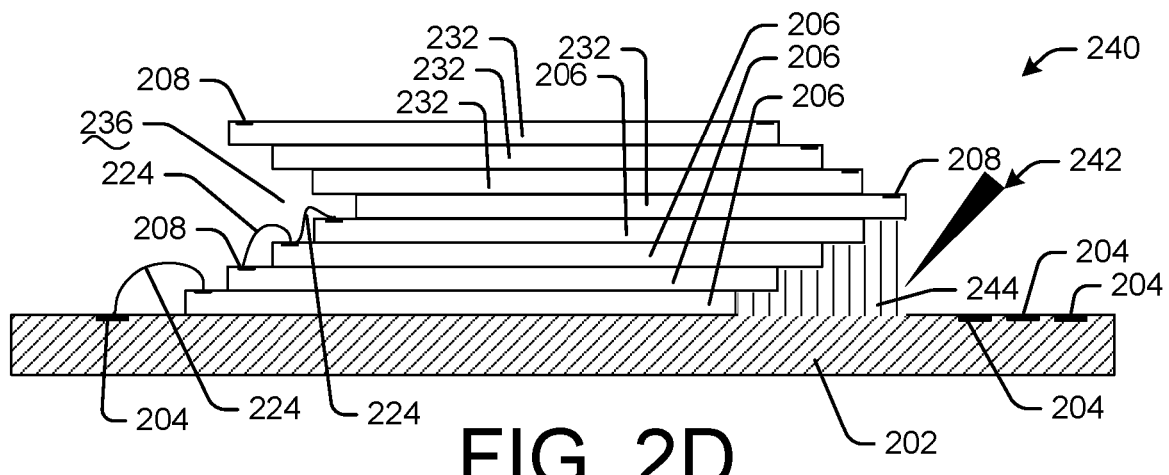

In FIG. 2D, a schematic cross-section of an example partially fabricated semiconductor package 240 with underfill epoxy 244 provided thereon is depicted, in accordance with example embodiments of the disclosure. The underfill epoxy 244 may be dispensed by a nozzle 242. The underfill epoxy 244 may be provided under or adjacent to the cavity 234 formed by the stacked dies 206, 232. Although the underfill epoxy 244 is shown as under stacked dies 206, 232, it will be appreciated that the underfill epoxy 244 may not be deposited in the depicted placement. The underfill epoxy 244 may move by capillary action and/or Van der Waals forces into the placement shown. Although the underfill epoxy 244 is depicted with a relatively straight sidewall, it will be appreciated that in some example embodiments, the underfill epoxy may have a curved sidewall, such as a fillet. Additionally, underfill epoxy residue may remain in portions of the package substrate 202 surface where the underfill epoxy 244 may be originally deposited.

Representative underfill epoxy materials may include an amine epoxy, imidizole epoxy, a phenolic epoxy or an anhydride epoxy. Other examples of underfill material include polyimide, benzocyclobutene (BCB), a bismalleimide type underfill, a polybenzoxazine (PBO) underfill, or a polynorborene underfill. Additionally, the underfill epoxy 244 may include one or more suitable filler materials, such as silica. In example embodiments, the underfill epoxy 244 may have fillers and/or other materials therein to preferentially control the coefficient of thermal expansion (CTE), reduce stresses, impart flame retardant properties, promote adhesion, and/or reduce moisture uptake in the underfill epoxy 244. Additives and/or chemical agents may be included in the underfill epoxy 244 for desirable properties, such as a preferred range of viscosity, a preferred range of tackiness, a preferred range of hydrophobicity (e.g., surface wetting), a preferred range on particle suspension properties, a preferred range of cure temperatures, combinations thereof, or the like.

Figure 2E:
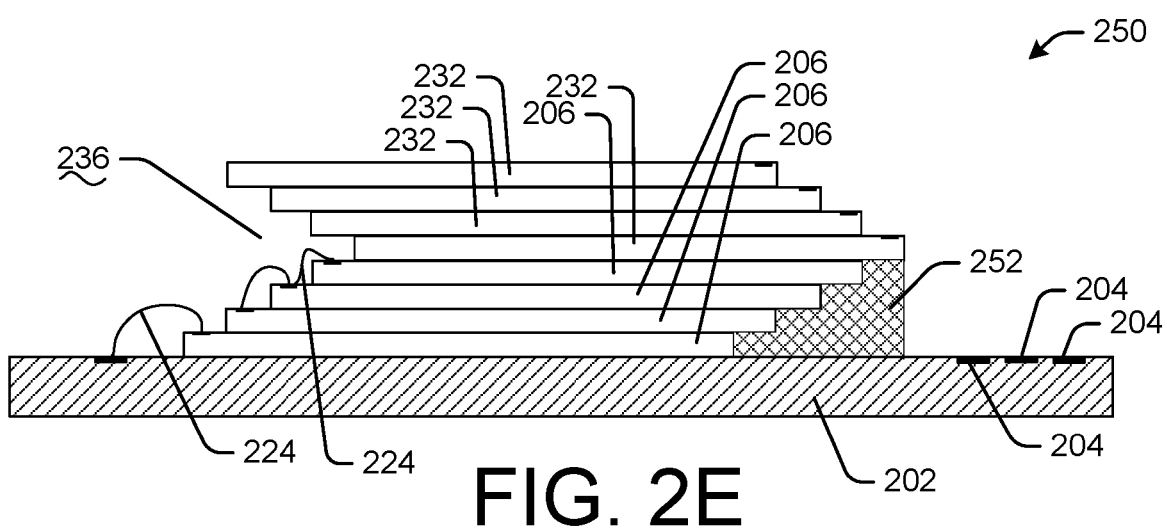

In FIG. 2E, a schematic cross-section of an example partially fabricated semiconductor package 250 with underfill 252 provided thereon is depicted, in accordance with example embodiments of the disclosure. The underfill epoxy 244 may be cured to form the underfill 252. The cure process may include heating, radiation (e.g., ultraviolet (UV) cure, and/or combinations thereof). During the cure process, the underfill epoxy 244 may cross-link and harden. Although the underfill is depicted with a relatively straight edge, it will be appreciated that there may be a fillet that is not straight.

Figure 2F:
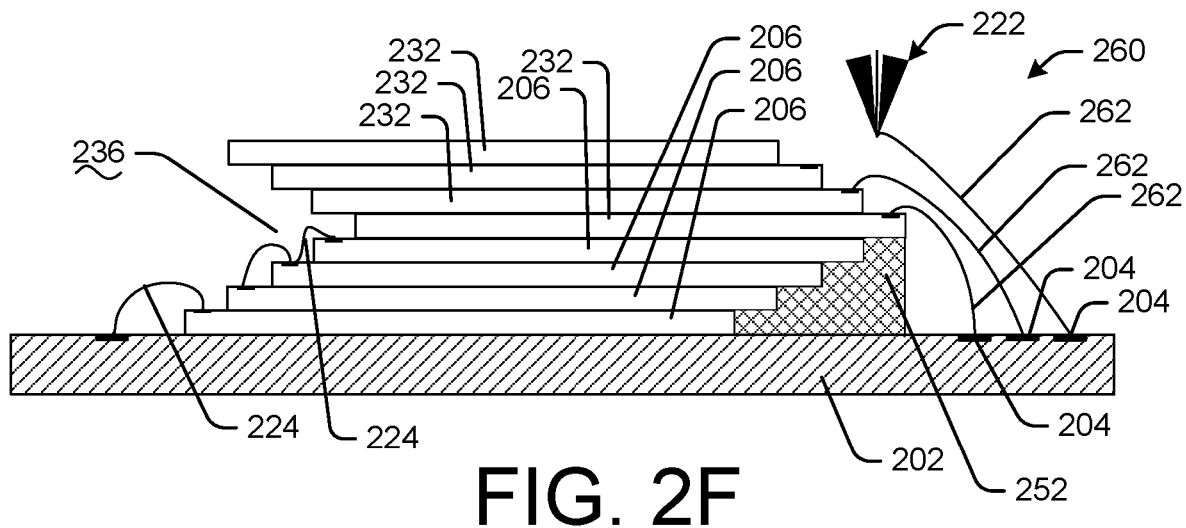

In FIG. 2F, a schematic cross-section of an example partially fabricated semiconductor package 260 with wire bonds 262 formed on the second set of dies 232 is depicted, in accordance with example embodiments of the disclosure. The wire bonds 262 may be formed by any suitable manner, such as in the same or different manner from how the wire bonds 224 were formed for the first set of dies 206. It will be appreciated that the wire bonds formed from the dies 232 may result in reduced deflection of overhang portions due to having the underfill 252 under at least a portion of the stacked dies 206, 232.

Figure 2G:
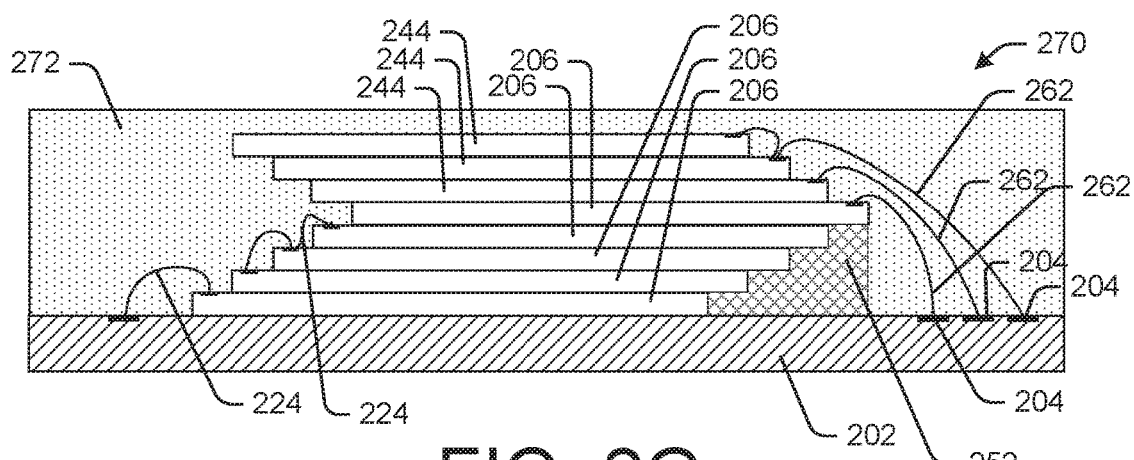

In FIG. 2G, a schematic cross-section of an example partially fabricated semiconductor package 270 with molding 272 formed encapsulating stacked dies 206, 232 is depicted, in accordance with example embodiments of the disclosure. Molding compound (e.g., mold epoxy) may be disposed on a top surface of the package substrate 202 and may encapsulate the bond pads 204, the wire bonds 224, 262, and/or the stacked dies 206, 232 disposed on the semiconductor package substrate 202. The molding material may be any suitable molding material. For example, the molding compound material may be a liquid dispensed thermosetting epoxy resin mold compound. The molding compound may be deposited on the surface of the semiconductor packaging substrate 202 using any suitable mechanism, including, but not limited to, liquid dispense, spin coating, spray coating, combinations thereof, or the like. The molding compound may be selected such that it adheres to the surface of the semiconductor package substrate 202, the stacked dies 206, 232, and/or the underfill 252. In example embodiments, the underfill may gap fill the cavity 236.

The mold compound, after dispense onto the top surface of the semiconductor package substrate 202, may be cured while pressure is applied thereon by a chase surface. In example embodiments, the chase (e.g., a relatively flat surface pressed on top of the liquid molding material disposed on top of the semiconductor package substrate 100) may itself be heated. Upon curing (e.g., cross-linking) the deposited molding compound may harden and form molding 272 to adhere to the semiconductor package substrate 202 and encapsulating the stacked dies 206, 232. In example embodiments, the molding 272 may have fillers and/or other materials therein to preferentially control the coefficient of thermal expansion (CTE), reduce stresses, impart flame retardant properties, promote adhesion, and/or reduce moisture unptake in the molding 272. The molding 272, in example embodiments, may be any suitable thickness. For example, the molding 272 may be approximately 1 millimeter (mm) thick. In other cases, the molding 272 may be approximately in the range between about 200 microns (μm) and 800 μm thick. In yet other cases, the molding 272 may be approximately in the range between about 1 mm and 2 mm thick.

Figure 2H:
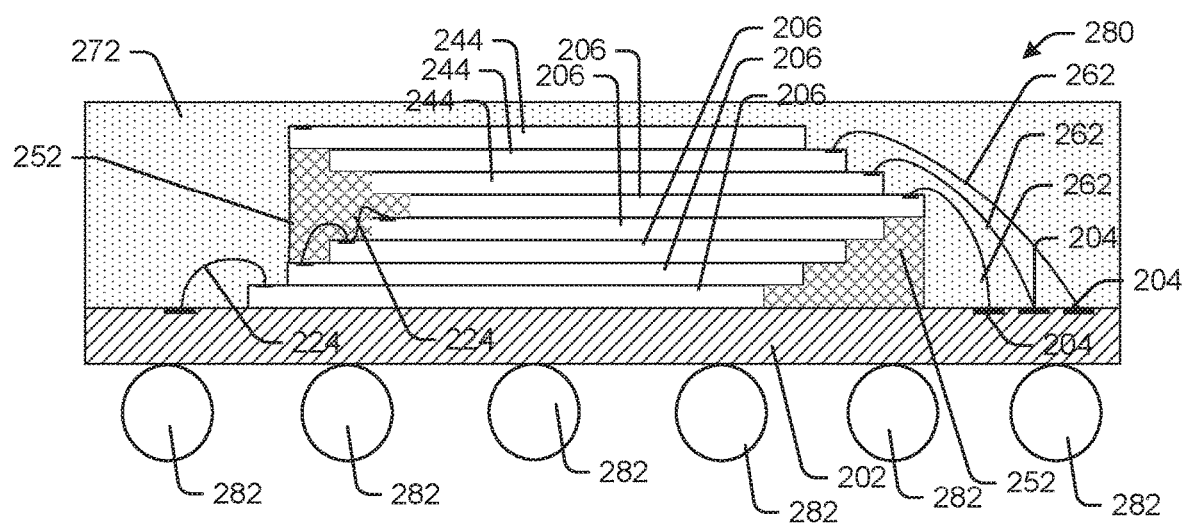

In FIG. 2H, a schematic cross-section of an example fabricated semiconductor package 280 with stacked dies 206, 232 is depicted, in accordance with example embodiments of the disclosure. One or more package-to-board interconnects 282 may be formed. In example embodiments, the semiconductor package-to-board level connections may be land grid array (LGA) connections, ball grid array (BGA) connections, or indeed, any suitable package-to-board interconnect.

The package substrate 202 may be singulated to form individual semiconductor packages 280 with supported stacked die, in accordance with example embodiments of the disclosure. The individual semiconductor packages, as fabricated on the semiconductor substrate panel may be singulated by cutting through the edges of each individual semiconductor package to provide a separation therebetween. The singulation may be performed using laser ablation, saw, or any other suitable mechanism. The singulation kerf width may be any suitable width between adjacent semiconductor packages 280. In example embodiments, the singulation process may cut through the molding and the semiconductor package substrate 202.

It will be appreciated that in the formation of semiconductor package 280, the use of underfill 252 to support one or more stacked dies 206, 232 may provide mechanical support during wire bonding to overhang portions of the stacked dies 206, 232. The mechanical support of the underfill 252 may result in not having cantilevered portions of stacked dies 206, 232 during the wire bonding process where forces may be imparted on to the surface of the stacked dies, particularly on cantilevered portions. Thus, the support provided by the underfill 252 may reduce the levels of deflection during the wire bonding process. Reducing deflection during the wire bonding process may have a variety of benefits for any or both of the wire bonds themselves and/or the stacked die.

It will be appreciated that while a first set of four dies followed by a second set of four dies were depicted in the process flow of FIGS. 2A-2H, there may be any suitable number of dies in the die stack and any suitable number of sets of dies disposed on the package substrate. As a non-limiting example there may be a first set of three dies followed by a second set of two dies provided in a die stack. In another non-limiting example, there may be a first set of five dies, a second set of five dies, and a third set of 3 dies disposed in the semiconductor package with supported stacked die.

It will also be appreciated that although wire bonding was depicted in the process flow of FIGS. 2A-2H on one side of a particular die or another. In some cases, such as for the top die of the die stack or when the dies of the die stack have dissimilar areas, wire bonding may be performed on more than one side of one or more of the dies of the die stack. For example, the top die of the die stack may be wire bonded to semiconductor package substrate level bond pads on two different sides of the top die. In some of these example embodiments, the cavity 236 may also be filled with underfill epoxy, such as in a similar manner to filling cavity 234, prior to wire bonding to bond pads of the top die that overlie the cavity 236.

It will still further be appreciated that the dies stack may be disposed on the package substrate along with other electrical components, such as on other areas of the surface of the semiconductor package substrate. These other electrical components may be any suitable electrical component including, but not limited to, surface mount devices (SMDs), integrated circuits, connectors, combinations thereof, or the like. The other electrical components may be electrically and mechanically attached to the package substrate by any suitable mechanism including, but not limited to metal pillar (e.g., copper pillar), flip chip bumps, solder bumps, any type of low-lead or lead-free solder bumps, tin-copper bumps, wire bonds, wedge bonds, C4, anisotropic conductive film (ACF), non-conductive film (NCF), combinations thereof, or the like.

Figure 3A:
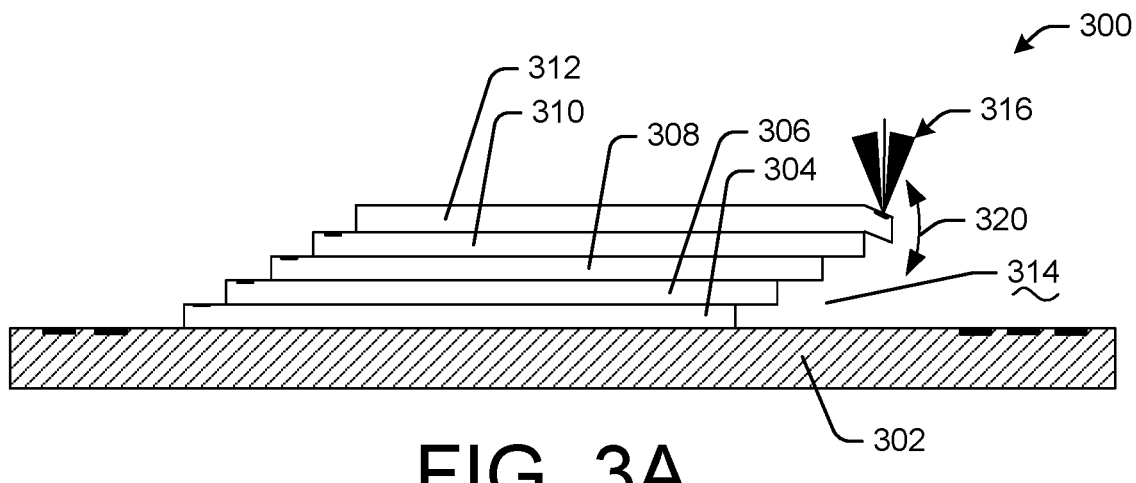
FIGS. 3A and 3B depict simplified cross-sectional schematic diagrams illustrating deflection of a cantilevered section and deflection of a supported section of a stacked die during wire bonding, in accordance with example embodiments of the disclosure.
Figure 3B:
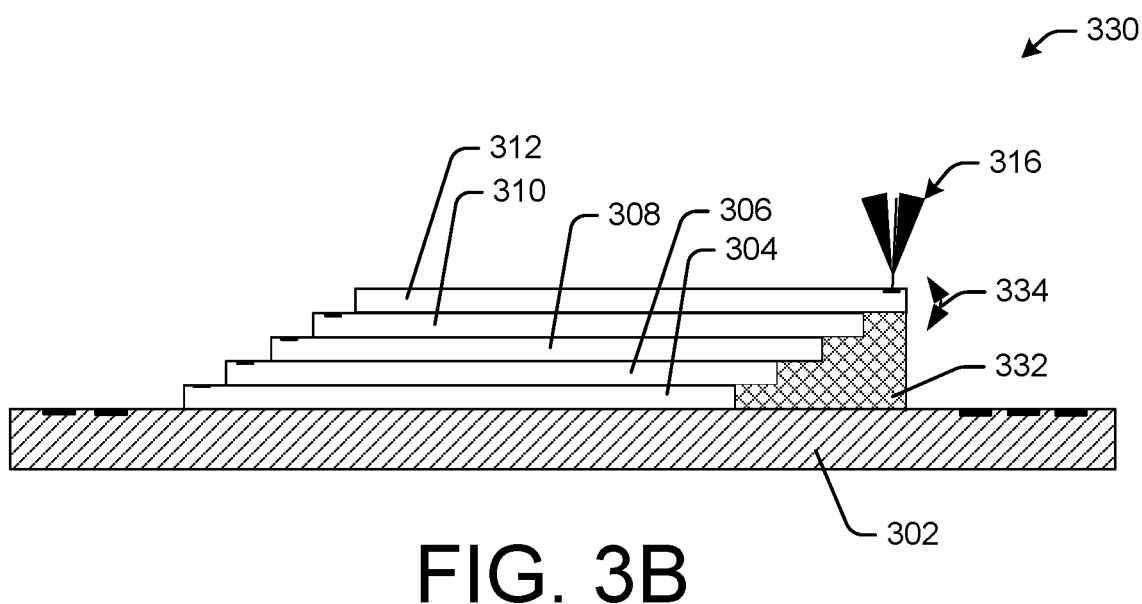

FIGS. 3A and 3B depict simplified cross-sectional schematic diagrams illustrating deflection 320 of a cantilevered section and deflection 334 of a supported section of a stacked die 304, 306, 308, 310, 312 during wire bonding, in accordance with example embodiments of the disclosure. The dies 304, 306, 308, 310, 312 may be disposed on a semiconductor package substrate 302. In FIG. 3A, without a support (e.g., underfill support) under the dies 304, 306, 308, 310, 312 may result in the formation of a cavity 314. Due to the cavity 314, when a wire bonding head 316 imparts forces on the surface of die 312, a relatively large deflection 320 of a cantilevered portion of the die 312 may result. In contrast, to the situation in FIG. 3A, in FIG. 3B, where there is an underfill support 332 disposed under at least portions of dies 306, 308, 310, 312, the deflection 334 of die 312 during wire bonding may be relatively reduced compared to the deflection 320.

The support provided by the underfill 332 may reduce the levels of deflection 334 from deflection 320 during the wire bonding process. Reducing deflection during the wire bonding process may have a variety of benefits for any of the wire bonds themselves, design constraints of the stacked dies 304, 306, 308, 310, 312, and/or the reliability of the stacked dies 304, 306, 308, 310, 312. With regards to the wire bond itself, if there is a reduced level of deflection 334 due to the presence of underfill 332 under the die 312 during wire bonding, then the wire bonding interface (e.g., ball surface) may be relatively more normal to the surface of a bond pad on the die 312 during wire bonding, thereby forming a relatively more reliable wire bond. Additionally, with the reduced deflection 334 during wire bonding, better alignment may be made to the bond pad on the surface of the die 312. As a result, it may be possible to perform wire bonding faster, with greater force, and/or with smaller bond pads, all of which may save time and/or money. Further still, a reduced level of deflection 334 may result in a reduced possibility of damaging (e.g., cracking) the die 312. In some cases, the reduced deflection 334 may allow for a relatively thinner die 312 without an appreciable increase in the possibility of cracking of the die 312.

Figure 4:
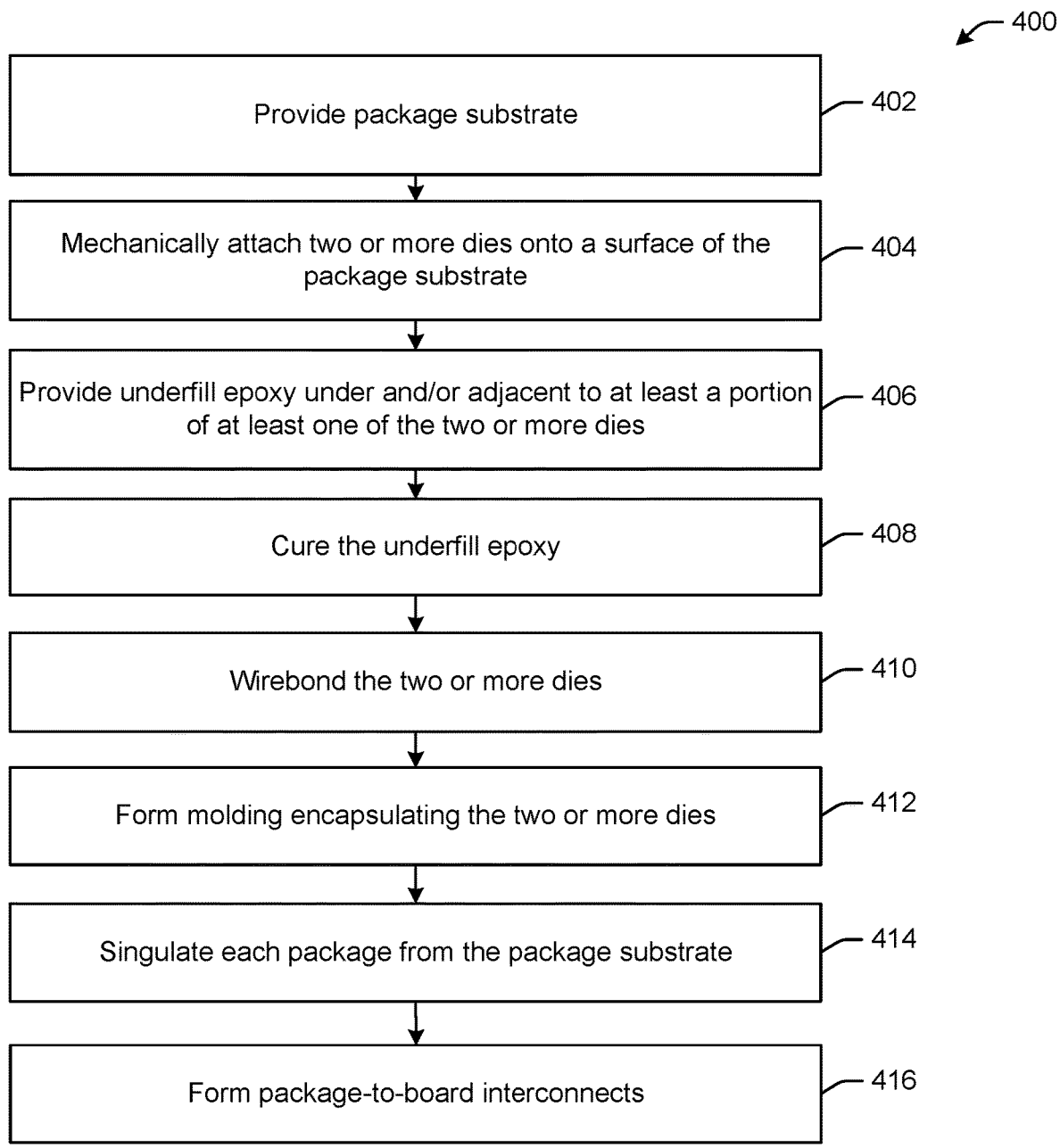
FIG. 4 depicts a flow diagram illustrating an example method for fabricating a semiconductor package with stacked die, in accordance with example embodiments of the disclosure.

FIG. 4 depicts a flow diagram illustrating an example method 400 for fabricating the semiconductor package with stacked die, in accordance with example embodiments of the disclosure. The method 400 may be used to fabricate a semiconductor package with stacked dies where underfill-based support may be provided prior to performing any wire bonding. In this case, a single set of stacked dies may be provided on the semiconductor package.

At block 402, a package substrate may be provided. At this point, the package substrate may be a substrate panel on which multiple semiconductor packages may be fabricated concurrently or nearly concurrently. The package substrate, as described above, may have build-up layers on either side of a substrate core. In some cases, a coreless package substrate may be used. The package substrate may have pads for wire bonding provided thereon. The semiconductor package substrate may be fabricated of any suitable material, including polymer material, ceramic material, plastics, composite materials, glass, epoxy laminates of fiberglass sheets, FR-4 materials, FR-5 materials, combinations thereof, or the like. The core and/or the interconnect build-up layers may be any variety of the aforementioned materials, and in some example embodiments, may not be constructed of the same material types.

At block 404, two or more dies may be mechanically attached to the surface of the package substrate. The two or more dies may be any suitable electronic components, including, but not limited to, memory devices, integrated circuits, active devices, passive devices, diodes, transistors, resistors, inductors, capacitors, MEMS, combinations thereof, or the like. The two or more dies may be mechanically coupled to the package substrate via any suitable mechanism, such as epoxy, adhesives, mechanical holders, metal contacts, or the like. The adhesive may, in example embodiments, be a thermosetting epoxy. The adhesive may be deposited by any variety of suitable mechanism including, but not limited to, spin coating, spray coating, squeegee, screen printing, combinations thereof, or the like. In example embodiments, the two or more dies may be stacked substantially directly on top of each other. In other example embodiments, there may be spacer materials provided between each of the two or more dies of the die stack. The two or more dies may have bond pads formed thereon, such as on a final metal routing layer of the dies. These bond pads may be suitable for wire bonding thereto. It will be appreciated that when the dies are stacked in a staggered and partially overlapping manner, a cavity may form under one or more of the two or more dies.

At block 406, underfill epoxy may be provided under and/or adjacent to at least a portion of at least one of the two or more dies. The underfill epoxy may be dispensed by a nozzle, in example embodiments. The nozzle may be aligned in proximity and/or under the two or more dies prior to dispensing a predetermined volume of underfill epoxy. In cases, where the underfill epoxy is not deposited directly under one of the two or more dies, the underfill may be in relatively close proximity, such that the underfill epoxy wicks (e.g., capillary action) under at least one of the two or more dies. The underfill epoxy may from a fillet, and in some cases may leave residue on the surface of the semiconductor substrate. Representative underfill epoxy materials may include an amine epoxy, imidizole epoxy, a phenolic epoxy or an anhydride epoxy. Other examples of underfill material include polyimide, benzocyclobutene (BCB), a bismalleimide type underfill, a polybenzoxazine (PBO) underfill, or a polynorborene underfill. Additionally, the underfill epoxy may include one or more suitable filler materials, such as silica. In example embodiments, the underfill epoxy may have fillers and/or other materials therein to preferentially control the coefficient of thermal expansion (CTE), reduce stresses, impart flame retardant properties, promote adhesion, and/or reduce moisture uptake in the underfill epoxy. Additives and/or chemical agents may be included in the underfill epoxy for desirable properties, such as a preferred range of viscosity, a preferred range of tackiness, a preferred range of hydrophobicity (e.g., surface wetting), a preferred range on particle suspension properties, a preferred range of cure temperatures, combinations thereof, or the like.

At block 408, the underfill epoxy may be cured. The underfill epoxy may be cured to form the underfill support under a cavity formed under at least one of the two or more dies. The cure process may include heating, radiation (e.g., ultraviolet (UV) cure, and/or combinations thereof). During the cure process, the underfill epoxy may cross-link and harden.

At block 410, the two or more dies may be wire bonded. The wire bonds may connect between two or more bond pads of the die, or between bond pads on the die and bond pads on the package substrate. Bond wire for wire bonding may be of any suitable material including, but not limited to, copper, gold, silver, aluminum, alloys and/or intermetallics of any of the preceding materials, combinations thereof, or the like. The bond wire may be attached using any suitable mechanism including, but not limited to, ball bonding, wedge bonding, compliant bonding, ultrasonic bonding, combinations thereof, or the like. In example embodiments, a wire bonding head may align and attach the wire bond to a bond pad.

At block 412, molding encapsulating the two or more dies may be formed. Forming the molding may entail depositing molding compound to a sufficient thickness to encapsulate the two or more dies and/or other components on the surface of the substrate. In example embodiments, the molding compound may be a thermosetting compound. In some cases, the molding compound may have one or more filler materials provided therein to engineer various physical, electrical, and/or thermal properties of the molding. After depositing the molding compound, a cure process may be performed to cross-link and/or harden the molding compound to form the molding.

At block 414, each package may be singulated from the package substrate. The singulation may be performed by any suitable mechanism, such as by laser ablation or saw cut. At block 416, package-to-board interconnects may be formed. In example embodiments, the semiconductor package-to-board level connections may be land grid array (LGA) connections, ball grid array (BGA) connections, or indeed, any suitable package-to-board interconnect. In some alternate example embodiments, the formation of package-to-board level connections may be performed prior to the singulation process (e.g., the order of the processes of blocks 414 and 416 may be reversed).

It should be noted, that the method 400 may be modified in various ways in accordance with certain embodiments of the disclosure. For example, one or more operations of method 400 may be eliminated or executed out of order in other embodiments of the disclosure. Additionally, other operations may be added to method 400 in accordance with other embodiments of the disclosure.

Figure 5:
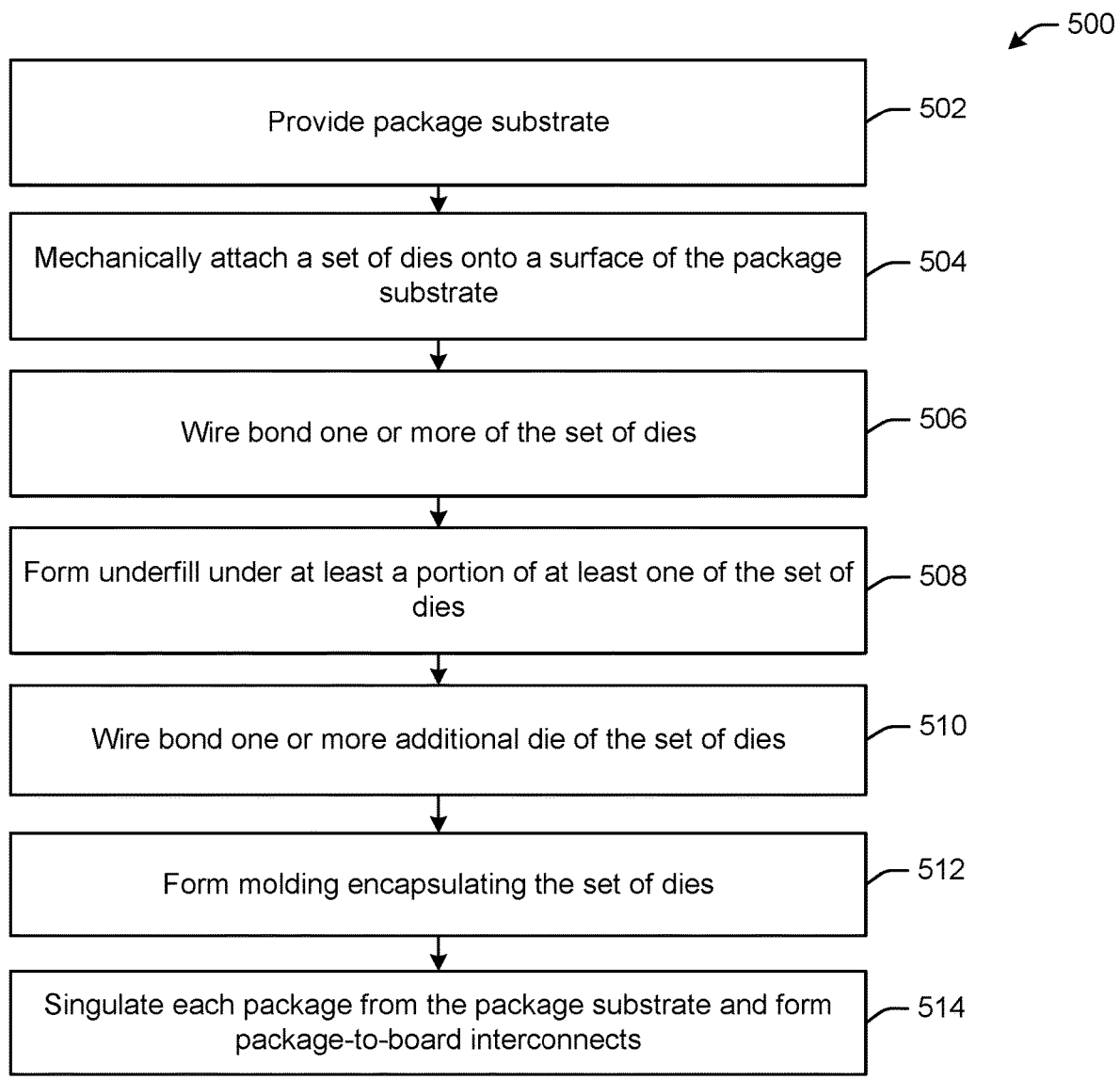
FIG. 5 depicts a flow diagram illustrating another example method for fabricating a semiconductor package with stacked die, in accordance with example embodiments of the disclosure.

FIG. 5 depicts a flow diagram illustrating another example method for fabricating a semiconductor package with stacked die, in accordance with example embodiments of the disclosure. This method 500 may be implemented when wire bonding may be implemented both before and after forming an underfill-based support under at least a portion of a die that is to be wire bonded.

At block 502, a package substrate may be provided. At this point, the package substrate may be a substrate panel on which multiple semiconductor packages may be fabricated concurrently or nearly concurrently. The package substrate, as described above, may have build-up layers on either side of a substrate core. In some cases, a coreless package substrate may be used. The package substrate may have pads for wire bonding provided thereon.

At block 504, a set of dies may be mechanically attached to a surface of the package substrate. The set of dies may be mechanically coupled to the package substrate via any suitable mechanism, such as epoxy, adhesives, mechanical holders, metal contacts, or the like. In example embodiments, the set of dies may be stacked substantially directly on top of each other. In other example embodiments, there may be spacer materials provided between each of the set of dies of the die stack. The set of dies may have bond pads formed thereon, such as on a final metal routing layer of the dies. These bond pads may be suitable for wire bonding thereto. It will be appreciated that when the dies are stacked in a staggered and partially overlapping manner, a cavity may form under one or more of the two or more dies.

At block 506, one or more of the set of dies may be wire bonded. The wire bonds may connect between two or more bond pads of the die, or between bond pads on the die and bond pads on the package substrate. Bond wire for wire bonding may be of any suitable material including, but not limited to, copper, gold, silver, aluminum, alloys and/or intermetallics of any of the preceding materials, combinations thereof, or the like. The bond wire may be attached using any suitable mechanism including, but not limited to, ball bonding, wedge bonding, compliant bonding, ultrasonic bonding, combinations thereof, or the like. In example embodiments, a wire bonding head may align and attach the wire bond to a bond pad.

At block 508, underfill may be formed under at least a portion of at least one of the set of dies. Underfill epoxy may be dispensed by a nozzle, in example embodiments. The nozzle may be aligned in proximity and/or under the two or more dies prior to dispensing a predetermined volume of underfill epoxy. In cases, where the underfill epoxy is not deposited directly under one of the set of dies, the underfill may be in relatively close proximity, such that the underfill epoxy wicks (e.g., capillary action) under at least one of the set of dies. The underfill epoxy may be cured to form the underfill support under a cavity formed under at least one of the set of dies. The cure process may include heating, radiation (e.g., ultraviolet (UV) cure, and/or combinations thereof). During the cure process, the underfill epoxy may cross-link and harden.

At block 510, one or more additional die of the set of dies may be wire bonded. The wire bonds may connect between two or more bond pads of the die, or between bond pads on the die and bond pads on the package substrate. Bond wire for wire bonding may be of any suitable material including, but not limited to, copper, gold, silver, aluminum, alloys and/or intermetallics of any of the preceding materials, combinations thereof, or the like. The bond wire may be attached using any suitable mechanism including, but not limited to, ball bonding, wedge bonding, compliant bonding, ultrasonic bonding, combinations thereof, or the like. In example embodiments, a wire bonding head may align and attach the wire bond to a bond pad.

At block 512, molding encapsulating the set of dies may be formed. Forming the molding may entail depositing molding compound to a sufficient thickness to encapsulate the set of dies and/or other components on the surface of the substrate. In example embodiments, the molding compound may be a thermosetting compound. In some cases, the molding compound may have one or more filler materials provided therein to engineer various physical, electrical, and/or thermal properties of the molding. After depositing the molding compound, a cure process may be performed to cross-link and/or harden the molding compound to form the molding.

At block 514, each package may be singulated form the package substrate and package-to-board interconnects may be formed. The singulation may be performed by any suitable mechanism, such as by laser ablation or saw cut. If laser ablation is used, then the cut width may be smaller than the width of the filled trenches. In this way, when the semiconductor packages are singulated from each other by cutting the semiconductor substrate panel, in accordance with example embodiments of the disclosure. Package-to-board interconnects may be formed. In example embodiments, the semiconductor package-to-board level connections may be land grid array (LGA) connections, ball grid array (BGA) connections, or indeed, any suitable package-to-board interconnect. In some alternate example embodiments, the formation of package-to-board level connections may be performed prior to the singulation process.

It should be noted, that the method 500 may be modified in various ways in accordance with certain embodiments of the disclosure. For example, one or more operations of method 500 may be eliminated or executed out of order in other embodiments of the disclosure. Additionally, other operations may be added to method 500 in accordance with other embodiments of the disclosure.

Figure 6:
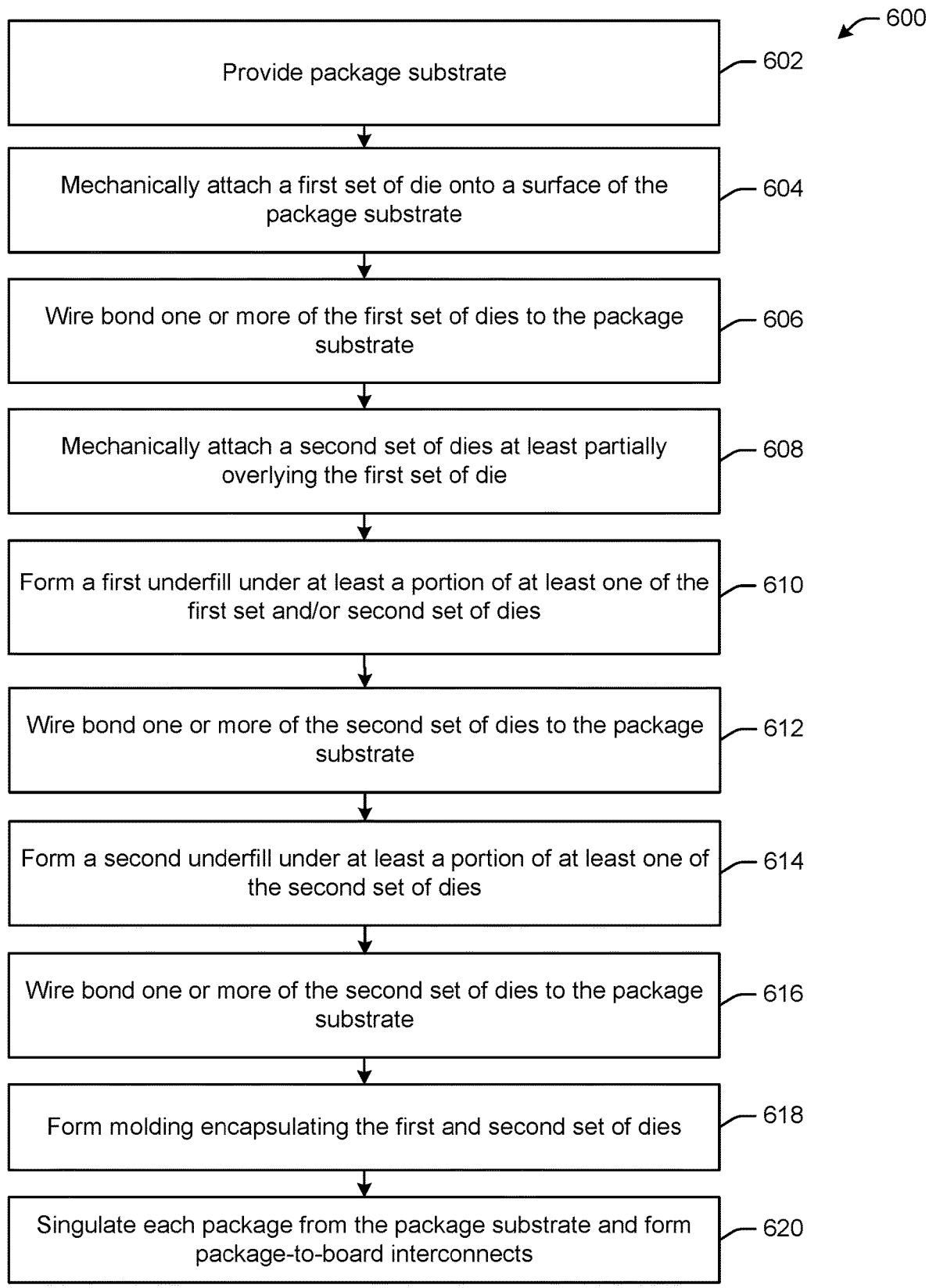
FIG. 6 depicts a flow diagram illustrating an example method for fabricating the semiconductor packages of FIG. 1B, in accordance with example embodiments of the disclosure.

FIG. 6 depicts a flow diagram illustrating an example method for fabricating the semiconductor packages of FIG. 1B, in accordance with example embodiments of the disclosure. This method 600 may be implemented for forming a semiconductor package 140 of FIG. 1B. In example embodiments, the method 600 allows for wire bonding a first set of stacked dies, attaching a second set of stacked dies, forming a first underfill-based support, wire bonding the second set of stacked dies, forming a second underfill-based support, and further wire bonding at least one of the second set of stacked dies.

At block 602, a package substrate may be provided. The package substrate, as described above, may have build-up layers on either side of a substrate core. In some cases, a coreless package substrate may be used. The package substrate may have pads for wire bonding provided thereon. At block 604, a first set of dies may be mechanically attached to a surface of the package substrate. At block 606, one or more of the first set of dies may be wire bonded to the package substrate. At block 608, a second set of dies may be mechanically attached to a surface of the package substrate. The second set of dies may be provided partially overlapping the first set of dies, such as in a staggered manner.

At block 610, a first underfill may be formed under at least a portion of at least one of the first and/or second set of dies. Underfill epoxy may be dispensed by a nozzle, in example embodiments. The nozzle may be aligned in proximity and/or under one or more of the first and/or second set of dies prior to dispensing a predetermined volume of underfill epoxy. In cases, where the underfill epoxy is not deposited directly under one of the set of dies, the underfill may be in relatively close proximity, such that the underfill epoxy wicks (e.g., capillary action) under at least one of the set of dies. The underfill epoxy may be cured to form the underfill support under a cavity formed under at least one of the set of dies. The cure process may include heating, radiation (e.g., ultraviolet (UV) cure, and/or combinations thereof). During the cure process, the underfill epoxy may cross-link and harden.

At block 612, one or more of the second set of dies may be wire bonded to the package substrate. It will be appreciated that one or more of the wire bonds may be formed in a die that may be partially supported/stabilized by underfill provided as part of the processes of block 610. At block 614, a second underfill may be formed under at least a portion of at least one of the second set of dies. At block 616, one or more of the second set of dies may be wire bonded to the package substrate. It will be appreciated that one or more of the wire bonds may be formed in a die that may be partially supported/stabilized by underfill provided as part of the processes of block 610.

At block 618, the molding encapsulating the two or more dies may be formed. Forming the molding may entail depositing molding compound to a sufficient thickness to encapsulate the stacked dies and/or other components on the surface of the substrate. After depositing the molding compound, a cure process may be performed to cross-link and/or harden the molding compound to form the molding. At block 620, each package may be singulated form the package substrate and package-to-board interconnects may be formed.

It should be noted, that the method 600 may be modified in various ways in accordance with certain embodiments of the disclosure. For example, one or more operations of method 600 may be eliminated or executed out of order in other embodiments of the disclosure. Additionally, other operations may be added to method 600 in accordance with other embodiments of the disclosure.

It will be appreciated that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the semiconductor packages with supported stacked die, as described herein. For example, microcontrollers, microprocessors, baseband processors, digital signal processors, memory die, field gate arrays, memory die, logic gate die, passive component die, MEMS, surface mount devices, application specific integrated circuits, baseband processors, amplifiers, filters, combinations thereof, or the like may be packaged in the semiconductor packages with supported stacked die, as disclosed herein. The semiconductor packages with supported stacked die, as disclosed herein may be provided in any variety of electronic device including, consumer, industrial, military, communications, infrastructural, and/or other electronic devices.

The semiconductor package with supported stacked die, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Braodwell®, Skylake®, etc.).

Additionally or alternatively, the semiconductor package with supported stacked die, as described herein, may be used to house one or more memory chips. The memory may include one or more volatile and/or non-volatile memory devices including, but not limited to, magnetic storage devices, read only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read only memory (EEPROM), non-volatile RAM (NVRAM), universal serial bus (USB) removable memory, or combinations thereof.

In example embodiments, the electronic device in which the semiconductor package with supported stacked dies is provided may be a computing device. Such a computing device may house one or more boards on which the semiconductor package with supported stacked die may be disposed. The board may include a number of components, including but not limited to a processor and/or at least one communication chip. The processor may be physically and electrically connected to board through, for example, electrical connections of the semiconductor package with supported stacked die. The computing device may further include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to example embodiments of the disclosure, there may be a semiconductor package, including: a substrate having a top substrate surface, the top substrate surface having a substrate bond pad; a first integrated circuit provided on the top substrate surface; a second integrated circuit provided over at least a portion of the first integrated circuit, wherein a portion of the second integrated circuit overhangs the first integrated circuit; an underfill support provided in at least a part of a volume of the portion of the second integrated circuit overhanging the first integrated circuit; and a wire connecting a bond pad of the second integrated circuit to the substrate bond pad. In some example embodiments, the underfill support includes one or more filler materials. In some additional example embodiments, the bond pad of the second integrated circuit is disposed on the portion of the second integrated circuit overhanging the first integrated circuit. In further example embodiments, the semiconductor package may include molding encompassing the first integrated circuit and the second integrated circuit. In further example embodiments, the substrate comprises a bottom substrate surface, wherein one or more package-to-board contacts are disposed on the bottom substrate surface. In still further example embodiments, the semiconductor package may include a third integrated circuit partially underlying the first integrated circuit, wherein the underfill support is disposed adjacent to the third integrated circuit and under a portion of the first integrated circuit.

According to example embodiments of the disclosure, the semiconductor package may be such that the underfill support is a first underfill support, and wherein the semiconductor package further includes a third integrated circuit overlying the second integrated circuit, wherein a portion of the third integrated circuit overhangs the second integrated circuit; and a second underfill support provided in at least a portion of a volume of the portion of the third integrated circuit overhanging the second integrated circuit. In further example embodiments, the second underfill support overlies a portion of the first integrated circuit. In still further example embodiments, the bond pad is a first bond pad, the substrate bond pad is a first substrate bond pad, and the wire is a first wire, wherein the top substrate surface comprises a second substrate bond pad, wherein the third integrated circuit comprises a second bond pad disposed on the portion of the third integrated circuit overhanging the second integrated circuit, and wherein the semiconductor package includes a second wire connecting the second bond pad to the second substrate bond pad. In yet further example embodiments, the bond pad is a first bond pad and the wire is a first wire, wherein the second die comprises a second bond pad, wherein the first die comprises a third bond pad, and wherein the semiconductor package further comprises a second wire connecting the second bond pad to the third bond pad. Example embodiments according to the disclosure may include an electronic device including any one of the aforementioned semiconductor packages.

According to example embodiments of the disclosure, there may be a method. The method may include providing a package substrate with a substrate top surface; attaching a first integrated circuit on the panel top surface; attaching a second integrated circuit at least partially overlying the first integrated circuit, wherein an overhang region of the second integrated circuit overhangs the first integrated circuit defining a cavity under the second integrated circuit; providing underfill epoxy in the cavity; and curing the underfill epoxy to form an underfill support in the cavity. In some example embodiments the method further includes wire bonding, after forming the underfill support, a first pad of the second integrated circuit to a first substrate bond pad of the package substrate, wherein the first bond pad is disposed on the overhang region. In further example embodiments, the method may include wire bonding, prior to providing the underfill epoxy in the cavity, a first pad of the first integrated circuit to a first substrate bond pad of the package substrate. In still further example embodiments, providing the underfill epoxy in the cavity further includes dispensing a predetermined volume of the underfill epoxy adjacent to the cavity. In still further example embodiments, attaching the first integrated circuit comprises applying an adhesive to the substrate top surface and placing the first integrated circuit over the adhesive. In yet further example embodiments, the method further includes forming a molding encapsulating the first integrated circuit and the second integrated circuit.

According to example embodiments of the disclosure, in the aforementioned method, forming the molding may include depositing liquid molding epoxy on the substrate top surface; and applying pressure and heat using a chase to drive cross-linking of the liquid molding epoxy to form the molding. In further example embodiments, the method may further include forming a package-to-board on a substrate bottom surface of the package substrate, the substrate bottom surface opposing the substrate top surface. In still further example embodiments, the cavity is a first cavity, the overhang region is a first overhang region, and the underfill support is a first underfill support, and wherein the method further includes attaching a third integrated circuit at least partially overlying the second integrated circuit, wherein a second overhang region of the third integrated circuit overhangs the second integrated circuit defining a second cavity under the third integrated circuit; and forming a second underfill support within the second cavity. In yet further example embodiments, the method may include wire bonding, after forming the second underfill support, a first pad of the second integrated circuit to a first substrate bond pad of the package substrate, wherein the first bond pad is disposed on the second overhang region.

The claimed invention is:

1. A semiconductor package, comprising:
   a substrate having a top substrate surface;
   a first integrated circuit provided on the top substrate surface, wherein the first integrated circuit is electrically connected to the substrate;
   a first intermediate integrated circuit comprising a first top surface and a first bottom surface, the first bottom surface of the first intermediate integrated circuit on the first integrated circuit, wherein the first intermediate integrated circuit comprises a first bond pad on the first top surface;
   a second intermediate integrated circuit comprising a second top surface and a second bottom surface, the second bottom surface on the first top surface such that a first portion of the first top surface is exposed, wherein the second intermediate integrated circuit comprises a second bond pad;
   a second integrated circuit comprising a third top surface and a third bottom surface, the second integrated circuit on the second top surface, wherein a first portion of the third bottom surface overhangs the second intermediate integrated circuit; and
an underfill support at least partially between the first portion of the third bottom surface and the first portion of the first top surface, wherein within the underfill support, a wire connects the first bond pad with the second bond pad, wherein the electrical connection between the first integrated circuit and the substrate is external to the underfill support.

2. The semiconductor package of claim 1, wherein the underfill support comprises one or more filler materials.

3. The semiconductor package of claim 1, wherein a third bond pad is disposed on a portion of the third top surface overhanging the second intermediate integrated circuit.

4. The semiconductor package of claim 1, further comprising molding encompassing the first integrated circuit and the second integrated circuit.

5. The semiconductor package of claim 1, wherein the substrate comprises a bottom substrate surface, wherein one or more package-to-board contacts are disposed on the bottom substrate surface.

6. The semiconductor package of claim 1, wherein the underfill support is a first underfill support, and a first portion of the second bottom surface overhangs the first intermediate integrated circuit, and wherein the semiconductor package further comprises:
a second underfill support provided in at least a portion of a volume of the first portion of the second bottom surface overhanging the first intermediate integrated circuit.

7. The semiconductor package of claim 6, wherein the second underfill support is in contact with a portion of the first integrated circuit.

8. The semiconductor package of claim 6, wherein the top substrate surface comprises a first substrate bond pad, and the wire is a first wire, wherein the top substrate surface comprises a second substrate bond pad, wherein the semiconductor package comprises a second wire connecting the second bond pad to the second substrate bond pad.

9. The semiconductor package of claim 1, wherein the wire is a first wire, wherein the second intermediate integrated circuit comprises a third bond pad, and wherein the semiconductor package further comprises a second wire connecting the second bond pad to the third bond pad.

10. The semiconductor package of claim 1, wherein the first intermediate integrated circuit comprises a first side surface, the second integrated circuit comprises a third side surface, and the underfill support comprises a fourth side surface, and wherein the fourth side surface is substantially parallel with the first side surface and the third side surface.

11. The semiconductor package of claim 1, wherein the second intermediate integrated circuit comprises a second side surface, and the underfill support comprises a fourth side surface, and wherein the fourth side surface is in contact with at least a portion of the second side surface.

12. A method, comprising:
providing a package substrate with a substrate top surface;
attaching a first integrated circuit on the substrate top surface, wherein the first integrated circuit is electrically connected to the package substrate;
attaching a first intermediate integrated circuit comprising a first top surface and a first bottom surface, the first bottom surface of the first intermediate integrated circuit on the first integrated circuit, wherein the first intermediate integrated circuit comprises a first bond pad on the first top surface;
attaching a second intermediate integrated circuit comprising a second top surface and a second bottom surface, the second bottom surface on the first top surface such that a first portion of the first top surface is exposed, wherein the second intermediate integrated circuit comprises a second bond pad;
attaching a second integrated circuit comprising a third top surface and a third bottom surface, the second integrated circuit on the second top surface, wherein an overhang region of a first portion of the third bottom surface overhangs the second intermediate integrated circuit defining a cavity under the second integrated circuit;
providing underfill epoxy in the cavity; and
curing the underfill epoxy to form an underfill support in the cavity, wherein the underfill support is at least partially between the first portion of the third bottom surface and the first portion of the first top surface, and wherein within the underfill support, a wire connects the first bond pad with the second bond pad, wherein the electrical connection between the first integrated circuit and the package substrate is external to the underfill support.

13. The method of claim 12, further comprising wire bonding, after forming the underfill support, a third bond pad of the second integrated circuit to a first substrate bond pad of the package substrate, wherein the third bond pad is disposed on the overhang region.

14. The method of claim 12, wherein further comprising wire bonding, prior to providing the underfill epoxy in the cavity, the first bond pad to a first substrate bond pad of the package substrate.

15. The method of claim 12, wherein providing the underfill epoxy in the cavity further comprises dispensing a predetermined volume of the underfill epoxy adjacent to the cavity.

16. The method of claim 12, further comprising forming a molding encapsulating the first integrated circuit and the second integrated circuit.

17. The method of claim 16, wherein forming the molding comprises:
depositing liquid molding epoxy on the substrate top surface; and
applying pressure and heat using a chase to drive cross-linking of the liquid molding epoxy to form the molding.

18. The method of claim 12, further comprising forming a package-to-board on a substrate bottom surface of the package substrate, the substrate bottom surface opposing the substrate top surface.

19. The method of claim 12, wherein the cavity is a first cavity, the overhang region is a first overhang region, the underfill support is a first underfill support, and a second overhang region of a first portion of the second bottom surface overhangs the first intermediate integrated circuit defining a second cavity under the second intermediate integrated circuit, and wherein the method further comprises:
forming a second underfill support within the second cavity.

20. The method of claim 19, further comprising wire bonding, after forming the second underfill support, a third bond pad of the second integrated circuit to a first substrate bond pad of the package substrate, wherein the third bond pad is disposed on the second overhang region.

* * * * *

UNITED STATES PATENT AND TRADEMARK OFFICE
CERTIFICATE OF CORRECTION

| | | |
|---|---|---|
| PATENT NO. | : 10,796,975 B2 | Page 1 of 1 |
| APPLICATION NO. | : 16/072222 | |
| DATED | : October 6, 2020 | |
| INVENTOR(S) | : Mao Guo | |

It is certified that error appears in the above-identified patent and that said Letters Patent is hereby corrected as shown below:

On the Title Page

Item (72), In "Inventors", in Column 1, Line 1, delete "Guo Mao" and insert --Mao Guo-- therefore.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*